United States Patent
Yoshida

(10) Patent No.: US 7,915,740 B2
(45) Date of Patent: Mar. 29, 2011

(54) SEMICONDUCTOR DEVICE

(75) Inventor: Tetsuya Yoshida, Gunma (JP)

(73) Assignees: Sanyo Electric Co., Ltd., Osaka (JP);
Sanyo Semiconductor Co., Ltd.,
Gunma (JP)

( * ) Notice: Subject to any disclaimer, the term of this patent is extended or adjusted under 35 U.S.C. 154(b) by 581 days.

(21) Appl. No.: 11/923,335

(22) Filed: Oct. 24, 2007

(65) Prior Publication Data

US 2008/0099926 A1 May 1, 2008

(30) Foreign Application Priority Data

Oct. 27, 2006 (JP) .................... 2006-292234

(51) Int. Cl.
*H01L 29/76* (2006.01)
(52) U.S. Cl. .. 257/778; 257/330; 257/401; 257/E23.141
(58) Field of Classification Search .................. 257/778,
257/E23.141, 330, 401
See application file for complete search history.

(56) References Cited

U.S. PATENT DOCUMENTS

| | | |
|---|---|---|
| 2003/0057503 A1 | 3/2003 | Yoneda et al. |
| 2006/0091542 A1* | 5/2006 | Zhao et al. ............... 257/738 |
| 2006/0151836 A1 | 7/2006 | Salcedo et al. |

FOREIGN PATENT DOCUMENTS

| | | |
|---|---|---|
| EP | 1 643 558 | 4/2006 |
| EP | 1 659 635 | 5/2006 |
| JP | 11-68042 | 3/1999 |
| JP | 2000-223693 A | 8/2000 |
| JP | 2002-118258 | 4/2002 |
| JP | 2002-353452 | 12/2002 |
| JP | 2002-368218 | 12/2002 |

OTHER PUBLICATIONS

EP Search Report mailed Jul. 17, 2009, directed to European Patent Application No. 07021118.0; 6 pages.

* cited by examiner

*Primary Examiner* — Cuong Q Nguyen
*Assistant Examiner* — Trang Q Tran
(74) *Attorney, Agent, or Firm* — Morrison & Foerster LLP

(57) ABSTRACT

Provided is a semiconductor device that can reduce the resistance in a horizontal direction of a substrate. A current path in a horizontal direction of a substrate is formed in a direction along a short side of the substrate (chip). For example, adopted is a layout in which an element region on an input terminal side and a current extraction region on an output terminal side are aligned along the short side of the chip. Furthermore, a first bump electrode and a second bump electrode, which are respectively connected to the input terminal and the output terminal, are arranged along the short side of the chip. Thus, the current path in the substrate in the horizontal direction in the substrate is formed to have a wide width and a short length. Accordingly, the resistance of the substrate in the horizontal direction is reduced.

9 Claims, 10 Drawing Sheets

Prior Art

Prior Art

SEMICONDUCTOR DEVICE

BACKGROUND OF THE INVENTION

This application claims priority from Japanese Patent Application Number JP 2006-292234 filed Oct. 27, 2006, the content of which is incorporated herein by reference in its entirety.

1. Field of the Invention

The present invention relates to a semiconductor device, particularly to a semiconductor device which can reduce a resistance in a flip chip mounting.

2. Description of the Related Art

In many discrete semiconductor devices (semiconductor chips), electrodes, respectively connected to an input terminal and an output terminal, are each provided to a different surface of the main surfaces (top surface and bottom surface) of the chip. On the other hand, also known has been a structure that makes a flip chip mounting possible by providing, on one main surface of the chip, a source electrode and a drain electrode respectively connected to an input terminal and an output terminal as well as a gate electrode connected to a control terminal in a MOSFET, for example. This technology is described, for instance, in Japanese Patent Application Publication No. 2002-368218.

Moreover, in another known structure, two MOSFETs are integrated into one chip while sharing a drain terminal, and source electrodes and gate electrodes are provided on one main surface of the chip. In this case, the mounting method is not limited to the flip chip mounting. Nevertheless, since the source electrodes of the two MOSFETs are respectively connected to the input terminal and the output terminal, the electrodes connected to an input terminal and an output terminal are provided on the one main surface of the chip as in the case of Japanese Patent Application Publication No. 2002-368218. This technology is described, for instance, in Japanese Patent Application Publication No. 2002-118258 (especially refer to FIG. 5 thereof).

With reference to FIG. 9, description will be given of a semiconductor device in which two MOSFETs are integrated into one chip as an example of the semiconductor device provided, on one main surface thereof, with an input terminal and an output terminal.

FIG. 9 is a plan view of a semiconductor device 30 which is formed by integrating a first MOSFET 31 and a second MOSFET 32 into one chip. To each of the MOSFETs 31 and 32, a source electrode and a gate pad electrode are connected. A first source electrode 35 and a first gate pad electrode 33 are for the MOSFET 31 while a second source electrode 36 and a second gate pad electrode 34 are for the MOSFET 32.

The two MOSFETs share a substrate (drain region). The first MOSFET 31 and the second MOSFET 32 are arranged, for example, in line symmetry about the center line X-X of the chip. The first gate pad electrode 33 and the second gate pad electrode 34 are independently disposed to the corners of the chip.

The first source electrode 35 and a first source bump electrode 35b, which are connected to a first source terminal S1, are provided on a first main surface Sf1 of the chip. The second source electrode 36 and a second source bump electrode 36b, which are connected to a second source terminal S2, are also provided on the first main surface Sf1. Similarly, the first gate pad electrode 33 and a first gate bump electrode 33b, which are connected to a first gate terminal G1, are provided on the first main surface Sf1. The second gate pad electrode 34 and a second gate bump electrode 34b, which are connected to a second gate terminal G2, are also provided on the first main surface Sf1.

In this case, a drain electrode is shared by the two MOSFETs 31 and 32 and not led out to the outside. A current path is formed by a control signal which is applied to gate electrodes of the two MOSFETs 31 and 32 and by the potential difference applied to each of the first source electrode 35 and the second source electrode 36. Specifically, the first source bump electrode 35b is an electrode connected to the input terminal (or the output terminal) of the MOSFET 30 while the second source bump electrode 36b is an electrode connected to the output terminal (or the input terminal) of the MOSFET 30.

FIG. 10 shows a schematic view of a current path when an electrode (for example, a source electrode S) connected to an input terminal IN and an electrode (for example, a drain electrode D) connected to an output terminal OUT are provided on a first main surface Sf1 of a discrete semiconductor MOSFET as in the case of Japanese Patent Application Publication No. 2002-368218.

A substrate is formed by stacking a low-concentration semiconductor layer LS on a high-concentration semiconductor substrate HS, and an element region e of the MOSFET is provided in the surface of the low-concentration semiconductor layer LS.

In the structure where the source electrode S and the drain electrode D are provided on the first main surface Sf1 of the chip, a current path CP' is mainly formed from the source electrode S on the first main surface Sf1 to the low-concentration semiconductor layer LS then to the high-concentration semiconductor substrate HS, back to the low-concentration semiconductor layer LS, and then to the drain electrode D. In other words, the current path CP' includes first current paths CP1', which are components mainly in vertical directions of the substrate, and a second current path CP2', which is a component mainly in a horizontal direction of the substrate. Accordingly, the resistance of the current path CP' from the source electrode S to the drain electrode D of the MOSFET is obtained by combining resistances Ra and Rc in the vertical directions of the substrate and a resistance Rb in the horizontal direction of the substrate.

For example, when a metal layer is formed on a second main surface Sf2 in the structure shown in FIG. 10, the current path in the horizontal direction is formed in or near the metal layer, which has a low resistance. Thereby, the resistance Rb in the horizontal direction can be reduced. However, in a bear chip or the like with which the flip chip mounting is performed, when a metal layer is not formed on the second main surface Sf2, the second current path CP2' is formed mainly in the high-concentration semiconductor substrate (for example, a silicon substrate) HS. Since the resistance of the high-concentration semiconductor substrate HS is higher than that of the metal layer, the resistance Rb in the horizontal direction depends more on the shape of the second current path CP2'.

The shape of the current path in the horizontal direction is determined by the shape of the chip (semiconductor substrate). Particularly, when the planar shape of the chip is approximately rectangular as shown in FIG. 9, the resistance Rb is significantly influenced by this shape.

FIG. 11 schematically shows a second current path of the MOSFET shown in FIG. 9.

In FIG. 11, for example, two of the first source bump electrodes 35b, which are connected to the input terminal, are disposed on the first MOSFET 31. For example, two of the second source bump electrodes 36b, which are connected to the output terminal, are disposed on the second MOSFET 32. Thus, the second current paths CP2' are formed between the first source bump electrodes 35*b* and the second source bump electrodes 36*b* as shown by the arrow.

In the above-described semiconductor device, the planar shape of the chip is rectangular, and the electrodes connected to the input and output terminals are disposed on the first main surface Sf1 of the chip. In the semiconductor device, the longer the length L' of the second current path CP2', which is the length between one end and the other end in the direction of a current flow, is, and the narrower the width W' of the second current path CP2' is, the larger the resistance Rb in the horizontal direction becomes. This causes a problem that the resistance of the whole device is increased.

SUMMARY OF THE INVENTION

This invention provides a semiconductor device including a rectangular semiconductor substrate, a discrete semiconductor element disposed on a first portion of a first primary plane of the rectangular semiconductor substrate, a first electrode disposed on the first portion of the first primary plane, and a second electrode disposed on a second portion of the first primary plane, wherein the device is configured to form a current path comprising a first path from the first electrode to a first part of the substrate below the first electrode, a second path from the first part to a second part of the substrate below the second electrode, and a third path from the second part of the substrate to the second electrode, and the second path is parallel to a short side of the rectangular semiconductor substrate.

This invention also provides a semiconductor device including a rectangular semiconductor substrate comprising two long sides and two short sides, an elongated input electrode disposed on a first surface of the substrate along one of the long sides of the substrate so that a direction of the elongation of the input electrode is parallel to the long sides, and an output electrode disposed on the first surface of the substrate between the elongated input electrode and another of the long sides of the substrate, wherein the rectangular semiconductor substrate comprises a high impurity substrate and a low impurity layer formed on the high impurity substrate, and the input electrode and the output electrode are electrically connected through the high impurity substrate.

This invention also provides a semiconductor device including a rectangular semiconductor substrate comprising two long sides and two short sides, a first elongated discrete semiconductor element disposed on a first surface of the substrate along one of the long sides of the substrate so that a direction of the elongation of the first elongated discrete semiconductor element is parallel to the long sides, and a second elongated discrete semiconductor element disposed on the first surface of the substrate along another of the long sides of the substrate so that a direction of the elongation of the second elongated discrete semiconductor element is parallel to the long sides, wherein the rectangular semiconductor substrate comprises a high impurity substrate and a low impurity layer formed on the high impurity substrate, and the first and second discrete semiconductor elements are electrically connected through the high impurity substrate.

DETAILED DESCRIPTION OF THE PREFERRED EMBODIMENTS

Description will be given, in detail, of embodiments of the present invention with reference to FIG. 1A to FIG. 8.

A semiconductor device according to the embodiments present invention includes a semiconductor substrate, an element region, a first electrode and a second electrode. The first and second electrodes are provided on a first main surface of the semiconductor substrate. A current path is formed from the first electrode to the second electrode through the inside of the semiconductor substrate.

In the element region, a discrete semiconductor element is formed. A discrete semiconductor element is also called an individual semiconductor and is a collective term for single-function semiconductor elements. Examples of the discrete semiconductor elements are a field-effect transistor (FET) typified by a MOSFET (Metal Oxide Semiconductor Field Effect Transistor), an IGBT (Insulated Gate Bipolar Transistor) and a junction FET, a bipolar transistor, a diode, a thyristor and the like.

FIG. 1A to FIG. 5C show, as an example of a first embodiment, a case where an n channel MOSFET is formed in the element region, and where a source electrode and drain electrodes are provided on a first main surface Sf1.

Figure 1A:
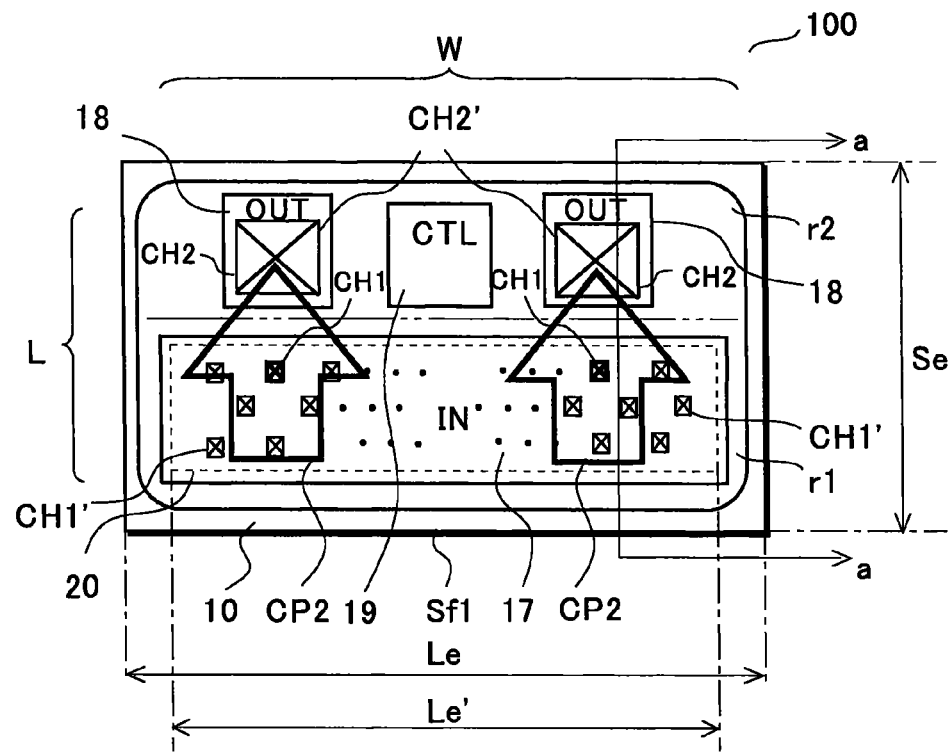
FIG. 1A is a plan view.
Figure 1B:
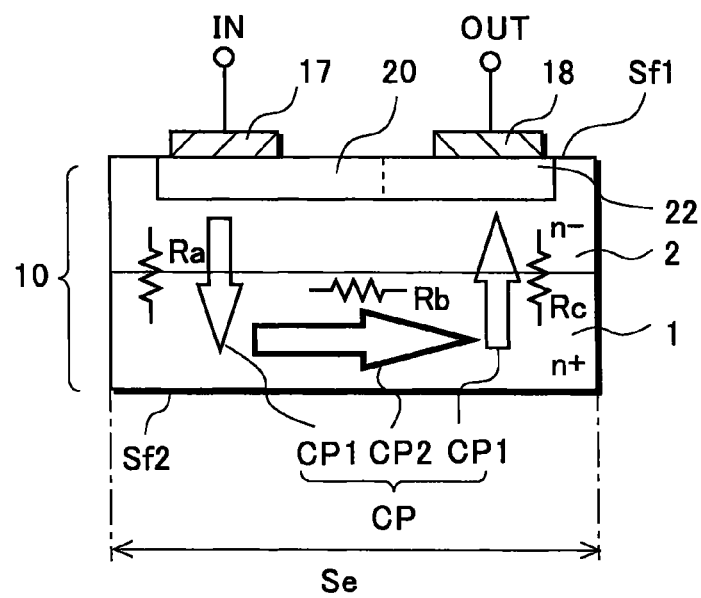
FIG. 1B is a side view, for describing a semiconductor device according to a first embodiment of the present invention.

FIG. 1A and FIG. 1B are schematic diagrams showing a MOSFET 100 according to this embodiment. FIG. 1A is a plan view of the MOSFET 100, and FIG. 1B is a schematic cross-sectional view taken along the line a-a in FIG. 1A.

As shown in FIG. 1A, a semiconductor substrate (semiconductor chip) 10 has the first main surface Sf1 and a second main surface (unillustrated here) on the reverse side of the first main surface Sf1. The shape of the semiconductor substrate 10 is, for example, approximately rectangular, having a long side Le and a short side Se. As an example, the length of the long side Le is 1.5 mm, and that of the short side Se is 1.0 mm.

As shown by a dotted line, an element region 20 of the MOSFET is provided on the first main surface Sf1 of the semiconductor substrate 10. A source electrode 17 is provided on the element region 20, the source electrode 17 being connected to the element region 20 via an insulating film or the like having a desired opening. Moreover, drain electrodes 18 and a gate pad electrode 19 are provided on the first main surface Sf1, and are also electrically connected to the element region 20 via an insulating film or the like having a desired opening.

The source electrode 17, the drain electrodes 18 and the gate pad electrode 19 are connected to a lead frame or a circuit board to serve as an external terminal via connecting, such as a bump electrode, a bonding wire and a metal plate.

Specifically, for example, the source electrode 17 is connected to an input terminal IN, the drain electrodes 18 are connected to output terminals OUT, and the gate pad electrode 19 is connected to a control terminal CTL. Accordingly, a current path is formed from the source electrode 17 to each of the drain electrodes 18 in the semiconductor substrate 10. Note that, in this embodiment, the source electrode 17 and the drain electrodes 18 respectively connected to the input terminal and the output terminals can be replaced with each other while the same result is obtained.

Description will be given of a current path CP with reference to FIG. 1B.

The semiconductor substrate 10 is formed by stacking a low-concentration semiconductor layer 2 on a high-concentration semiconductor substrate 1, and the element region 20 of the MOSFET is provided in the surface of the low-concentration semiconductor layer 2. The detail will be described later.

In this embodiment, the source electrode 17 connected to the input terminal IN and the drain electrodes 18 connected to the output terminals OUT are disposed on the first main surface Sf1 as described above. Thus, the current paths CP are formed from the source electrode 17 to each of the drain electrodes 18 in the semiconductor substrate 10.

More specifically, the current path CP includes first current paths CP1, which are components approximately vertical to the first main surface Sf1, and a second current path CP2, which is a component approximately horizontal to the first main surface Sf1. The first current paths CP1 include a path from the source electrode 17 to the high-concentration semiconductor substrate 1 through the low-concentration semiconductor layer 2, and a path from the high-concentration semiconductor substrate 1 to the drain electrode 18 through the low-concentration semiconductor layer 2. Additionally, the second current path CP2 is a path formed in a horizontal direction of the semiconductor substrate 10 from mainly the high-concentration semiconductor substrate 1 and the low-concentration semiconductor layer 2 near the substrate 1 below the source electrode 17 to mainly the high-concentration semiconductor substrate 1 and the low-concentration semiconductor layer 2 near the substrate 1 below the drain electrodes 18.

In this embodiment, as shown in FIG. 1A and FIG. 1B, a layout for the element region 20 of the semiconductor substrate 10 is designed as follows. The main direction of the second current path CP2 is formed along the short side Se of the semiconductor substrate (chip) 10, that is, the direction in which current flows in the second current path CP2 is the direction in which the short side Se extends. The width of the path CP2 in which the current flows is parallel to the direction in which the long side Le extends.

The description will be given with the simplest example as follows. The semiconductor substrate 10 is partitioned into a first region r1 and a second region r2 by the line along the long side Le (see the chain double-dashed line) for convenience of the description. In the first region r1, the element region 20 and the source electrode 17 are provided in the input side of the second current paths CP2 in the direction of the formation (the direction in which current flows). In the second region r2, the drain electrodes 18 and a conductive path (for example, a high-concentration impurity region) 22 are provided. The drain electrodes 18 respectively are provided in the output side of the respective second current paths CP2 in the direction of forming the current paths CP2. The conductive path 22 connects the element region 20 to the drain electrodes 18. The first region r1 (element region 20) and the second region r2 (conductive path 22) are arranged in the manner of being aligned along the short side Se of the semiconductor substrate 10, and thereby the second current path CP2 is formed in a direction along the short side Se of the semiconductor substrate 10.

Because the shape of the semiconductor substrate 10 is rectangular, when the second current path CP2 is formed in the direction along the short side Se of the semiconductor substrate 10, a width W of the second current path CP2 is enlarged, and a length L thereof is shortened. For example, in the layout of FIG. 1A, the area for the width W is sufficiently secured in parallel to the direction of the long side Le, and the length L is made equal to or shorter than the short side Se.

Figure 11:
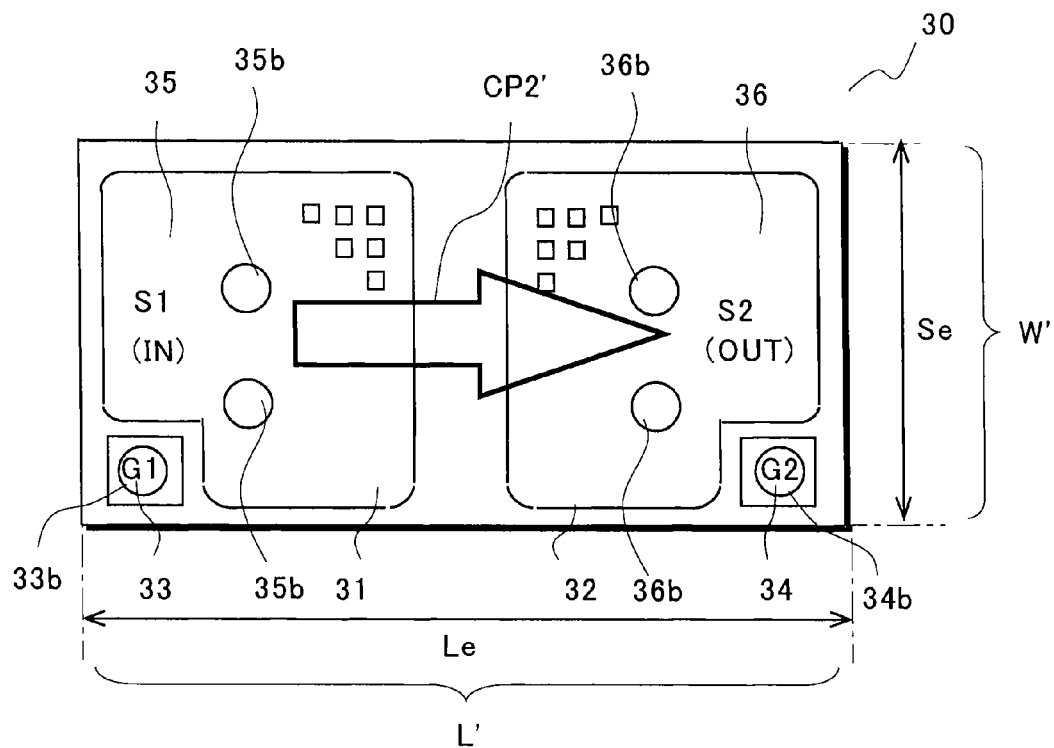
FIG. 11 is a plan view for describing the first conventional semiconductor device.

Accordingly, the resistance of the second current path CP2 in this embodiment can be reduced compared with the case of, for example, forming the second current path CP2' having the length L' in the direction of the long side Le of the semiconductor substrate 10 and the width W' parallel to the direction of the short side Se thereof as shown in FIG. 11.

Note that, in this embodiment, when the second current paths CP2 are formed in apparently different directions from each other, it is only necessary that the main direction of the second current paths CP2 be the direction along the short side Se.

Moreover, this embodiment includes a large number of first contact holes (for example, on source regions) CH1', which electrically connect the source electrode 17 to the element region 20, and second contact holes CH2' (for example, on the regions in the conductive path 22 which are in contact with the drain electrodes 18), which electrically connect the drain electrodes 18 to the element region 20. Here, the large number of first contact holes CH1' are formed in the insulating film (unillustrated) on the first region r1 of the substrate 10. The second contact holes CH2' are formed in the insulating film (unillustrated) on the second region r2 of the substrate 10. The second contact hole CH2' is larger than the first contact hole CH1'. An opening having an area slightly smaller than that of the drain electrode 18, for example, is made in the insulating film, through which the single second contact hole CH2' is provided below each of the two drain electrodes 18, here. Among the multiple first contact holes CH1' and the second contact holes CH2', a set of a first contact hole CH1 and a second contact hole CH2 which come closest to each other is aligned in the direction along the short side Se. Thus, the main direction of the second current path CP2 is formed along the short side Se.

As described above, as long as the source electrode 17 is connected to the first contact holes CH1' and the drain electrodes 18 are connected to the second contact holes CH2', the pattern and the arrangement of these electrodes 17 and 18 are not limited to the above case.

Furthermore, FIG. 1A shows a case in which the element region 20 is in a rectangular shape a long side Le' of which is approximately equal to the long side Le of the semiconductor substrate 10. Nevertheless, as long as the second current paths CP2 are formed in the direction along the short side Se of the semiconductor substrate 10, the pattern of the element region 20 is not limited to the one illustrated in FIG. 1A.

Figure 2:
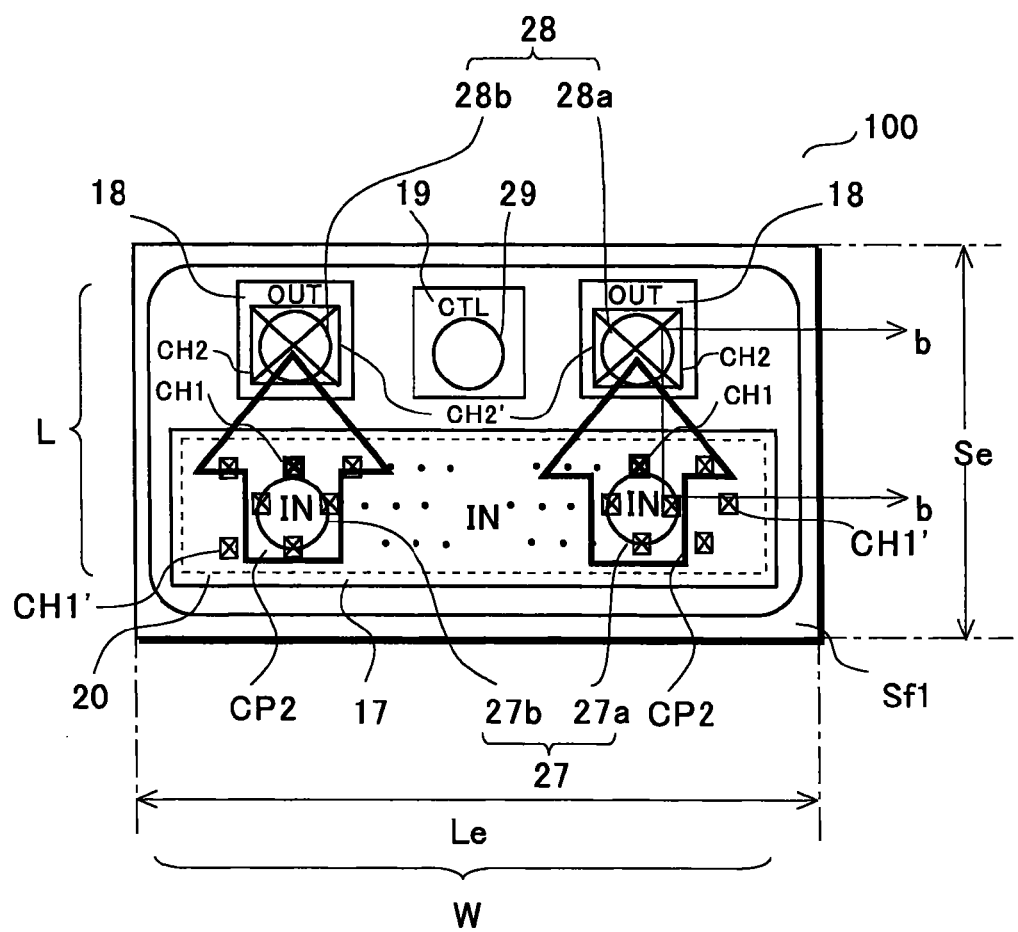
FIG. 2 is a plan view for describing the semiconductor device according to the first embodiment of the present invention.

Next, FIG. 2 is a plan view showing that bump electrodes to be respectively connected to the source electrode 17, the drain electrodes 18 and the gate pad electrode 19 are provided in this embodiment.

The source electrode 17, the drain electrodes 18 and the gate pad electrode 19 are respectively provided with source bump electrodes 27, drain bump electrodes 28 and a gate bump electrode 29 thereon. These bump electrodes serve as external connection electrodes, and are shown by circles. The source bump electrodes 27 and the drain bump electrodes 28 are respectively connected to the input terminals IN and the output terminals OUT of the MOSFET. The gate bump electrode 29 is connected to the control terminal CTL.

FIG. 2 shows that the two source bump electrodes 27 and the two drain bump electrodes 18 are provided, and specifically a total of five bump electrodes are provided, that is, source bump electrodes 27a and 27b, drain bump electrodes 28a and 28b, and the gate bump electrode 29. Note that, the number of each bump electrode 27, 28 and 29 is not limited to the one illustrated.

In this embodiment, when the bump electrodes are provided as described above, the straight line between a first bump electrode (source bump electrode 27) and a second bump electrode (drain bump electrode 28) is arranged along the short side Se so as to be parallel to the short side Se, the first bump electrode and the second bump electrode being positioned closest to each other among the bump electrodes respectively connected to the input and output terminals.

For example, when the multiple first and second bump electrodes exist as shown in FIG. 2, the set (of the source bump electrode 27a and the drain bump electrode 28a) which has the closest distance among the combinations of the first and second bump electrodes is provided in the direction along the short side Se. Thereby, the main direction of the second current paths CP2 is formed along the short side Se.

Each electrode (source electrode 17, drain electrode 18, source bump electrode 27 and drain bump electrode 28) on the first main surface Sf1 also has a great influence on the resistance of the semiconductor device. For example, when each electrode and a wire connected thereto are arranged around on the first main surface Sf1, the amount of the resistance component in the horizontal direction is also increased.

In this embodiment, in addition to the first and second contact holes CH1 and CH2, the first bump electrode (source bump electrode 27) and the second bump electrode (drain bump electrode 28) which are positioned closest to each other are aligned in the direction along the short side Se.

Thus, the second current path CP2 formed along the short side Se is connected to external terminals (the input terminal IN and the output terminal OUT) without being arranged around in the horizontal direction on the first main surface Sf1. As a consequence, the resistance of each electrode in the horizontal direction is also reduced as much as possible, resulting in significantly contributing to the reduction in the resistance of the device.

Figure 3:
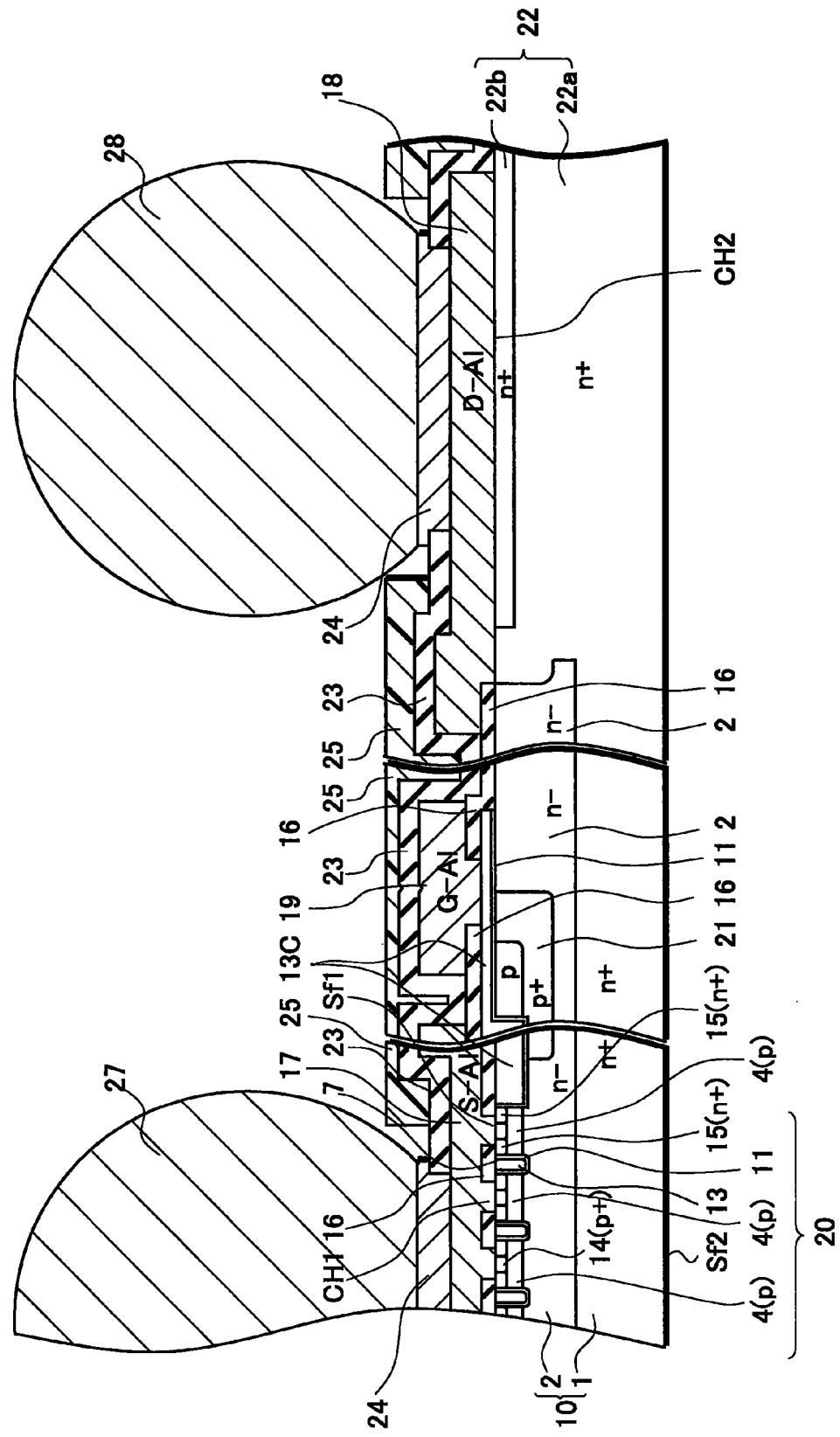
FIG. 3 is a cross-sectional view for describing the semiconductor device according to the first embodiment of the present invention.

FIG. 3 is a cross-sectional view showing the MOSFET 100 in detail, and corresponds to the cross section taken along the line b-b in FIG. 2.

The semiconductor substrate 10 has the first main surface Sf1 and a second main surface Sf2, and is provided with the element region 20 of the MOSFET 100.

Specifically, the semiconductor substrate 10 is formed by stacking the n− type semiconductor layer (for example, an n− type epitaxial layer) 2 on the n+ type silicon semiconductor substrate 1, and thereby a drain region is formed. A channel layer 4, which is a p type impurity region, is formed on a surface of the n− type semiconductor layer 2 serving as the first main surface Sf1.

Trenches 7 are formed so as to reach the n− type semiconductor layer 2, penetrating through the channel layer 4. Generally, the trenches 7 are patterned into a lattice or stripe shape in the plane pattern of the first main surface Sf1.

A gate oxide film 11 is provided on the inner wall of each of the trenches 7. The thickness of the gate oxide film 11 is approximately several hundred Å in accordance with a driving voltage of the MOSFET. Additionally, a conductive material is buried inside the trench 7 to form a gate electrode 13. The conductive material is, for example, a polysilicon to which, for example, n type impurities are introduced in order to reduce the resistance.

Source regions 15 are n+ type impurity regions formed by implanting n type impurities in regions of the surface of the channel layer 4, the regions adjacent to the trenches 7. Moreover, a body region 14, which is a diffusion region of p+ type impurities, is formed in a region of the surface of the channel layer 4, the region between the source regions 15 adjacent to each other. Thereby, the electric potential of the substrate is stabilized. Accordingly, the portion surrounded by the trenches 7 adjacent to each other forms one cell of a MOS transistor. A large number of these cells collectively constitute the element region 20 of the MOSFET.

Note that, for convenience of the description in this embodiment, the element region 20 extends across the region where the cells of the MOS transistor positioned on the outermost periphery are provided. A guard ring 21, which is a high-concentration p type impurity region, is formed on the outer periphery of the element region 20.

The gate electrode 13 is covered by an interlayer insulating film 16. The source electrode 17 is a metal electrode formed by sputtering aluminium (Al) or the like and then patterning the resultant into a desired shape. The source electrode 17 covers the element region 20, and is provided on the first main surface Sf1 of the semiconductor substrate 10. The source electrode 17 is connected to the source regions 15 and the body regions 14 through multiple contact holes (the first contact holes CH1') formed in the interlayer insulating film 16.

The gate electrode 13 is pulled onto the substrate 10 by connecting portion 13c, and is extended to a gate connecting electrode 19, which surrounds the periphery of the semiconductor substrate 10, and thereby connected to the gate pad electrode (unillustrated here).

A nitride film 23 is provided on the source electrode 17, and an opening is made in a predetermined region of the nitride film 23 to form a under bump metal (UBM) 24. The UBM 24 is a metal layer formed by stacking nickel (Ni: 2.4 μm in thickness) and gold (Au: 500 Å in thickness) in this order from the lower layer by electrodes plating, for example. Moreover, on the nitride film 23, a solder resist 25, from which the UBM 24 is exposed, is provided. The source bump electrode 27 is formed by a screen printing using the UBM 24 as a bottom electrode. The diameter of the source bump electrode 27 is approximately 250 μm. Note that, FIG. 3 shows a case that the source bump electrode 27 is disposed on an edge portion of the element region 20 for convenience of the description. However, in reality, the source bump electrode 27 is arranged so that the source potential can be applied to the element region 20 uniformly.

The drain electrode 18 is provided on the first main surface Sf1 of the semiconductor substrate 10. The drain electrode 18 is formed by patterning a metal layer (for example, Al), which is the same as that used in the source electrode 17, into a desired shape, and is placed with a space between the drain electrode 18 and the source electrode 17. The drain bump electrode 28 is provided above the drain electrode 18 as in the case of the source bump electrode 27.

Below the drain electrode 18, the conductive path 22, which extracts the current from the element region 20, is provided. The conductive path 22 is formed of, for example, an n type high-concentration impurity region (n+ type impurity region) 22a and an n+ type impurity region 22b to be the second contact hole CH2. The conductive path 22 reaches the n+ type silicon semiconductor substrate 1 from the surface of the n– type semiconductor layer 2. The drain electrode 18 is connected to the drain region (the n– type semiconductor layer 2 and the n+ type silicon semiconductor substrate 1) of the element region 20 via the conductive path 22.

In a case of a bear chip with which the flip chip mounting is performed, it is known that a metal layer is provided on the bottom surface (second main surface Sf2) to reduce the resistance. However, the metal layer on the bottom surface is not intended to be used as an electrode. Hence, the metal layer is omitted in some cases, particularly in a product which is critical in terms of cost. By employing this embodiment, it is possible to reduce the resistance in the semiconductor device while reducing the cost by not providing a metal layer on the bottom surface.

Figure 4:
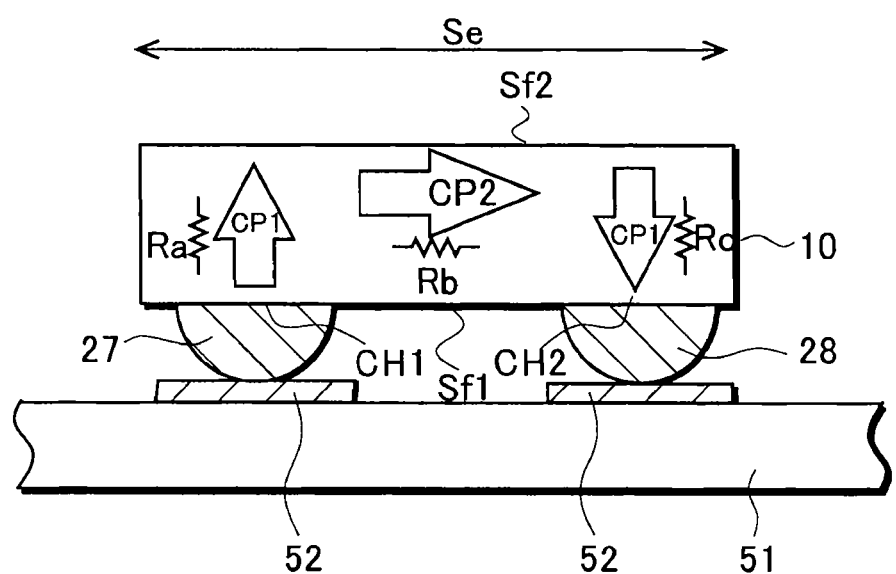
FIG. 4 is a side view for describing the semiconductor device according to the first embodiment of the present invention.

FIG. 4 shows a side view of a circuit board (printed board) or the like on which the flip chip mounting is performed as an example of a semiconductor substrate (semiconductor chip) 10. FIG. 4 is a drawing viewed in the direction of a short side Se of the chip. The illustration of an element region 20 and the like of the semiconductor substrate 10 will be omitted in FIG. 4.

The semiconductor chip 10 is disposed, while facing down, on a circuit board 51 provided with conductive patterns 52. A source bump electrode 27, a drain bump electrode 28 and a gate bump electrode (unillustrated here) are aligned with the corresponding conductive patterns 52, and then adhered and connected thereto by reflow soldering with heat or using the ultrasonic vibration under a pressurized condition.

As described above, in this embodiment, a first main surface Sf1 is provided with a source electrode (source bump electrode 27) connected to an input terminal, and a drain electrode (drain bump electrode 28) connected to output terminals. Accordingly, at the time of operating a MOSFET 100, a current path is formed mainly from the source electrode (source bump electrode 27) to the drain electrode (drain bump electrode 28) through the semiconductor substrate 10 (the element region 20, an n– type semiconductor layer 2, an n+ type silicon semiconductor substrate 1 and a conductive path 22) as shown by the arrow in FIG. 4.

In this embodiment, the element region 20 and the conductive path 22 are arranged so that a second current path CP2, which significantly influences the resistance of the semiconductor device, can be formed in a direction along the short side Se of the semiconductor substrate 10. Moreover, a first contact hole CH1 and a second contact hole CH2 which are positioned closest to each other, and which are respectively connected to the input and output terminals, as well as the source bump electrode 27 and the drain bump electrode 28 which are positioned closest to each other and, which are respectively connected to the input and output terminals, are aligned along the short side Se (see FIG. 1A and FIG. 1B).

Thus, a width W of the second current path CP2 is sufficiently secured along a long side Le of the semiconductor substrate 10, and a length L of the second current path CP2 is made equal to or shorter than the short side Se. Hence, a resistance Rb of the substrate 10 in a horizontal direction is greatly reduced, resulting in significantly contributing to the reduction in the resistance of the device.

Note that the bump electrodes to serve as external connection electrodes may not be disposed in the pattern shown in FIG. 2 in some cases due to the terminal layout for the circuit board 52 on which the semiconductor substrate (chip) 10 is mounted. However, it is possible to connect each electrode and bump electrode to the element region 20 by employing, for example, a multilayer electrode structure on the first main surface Sf1.

Figure 5A:
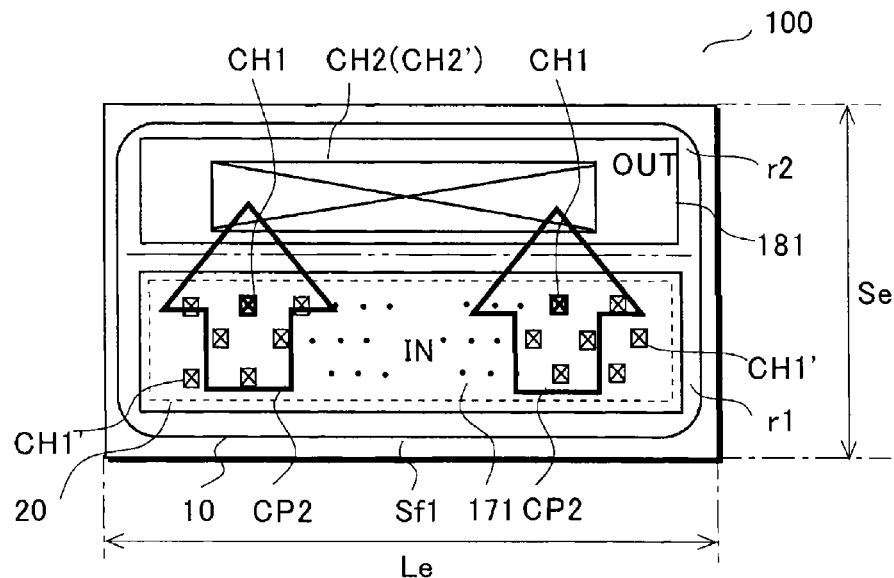
FIG. 5A to FIG. 5C are plan views for describing the semiconductor device according to the first embodiment of the present invention.
Figure 5B:
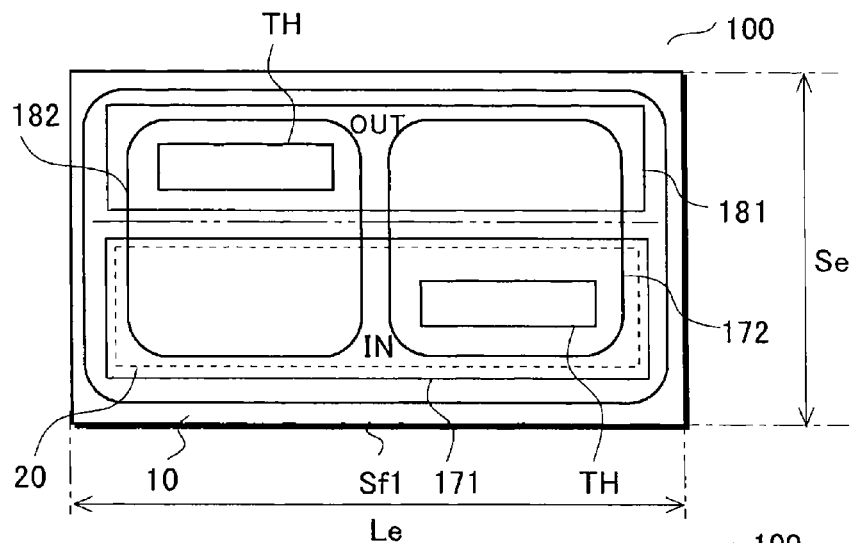
Figure 5C:
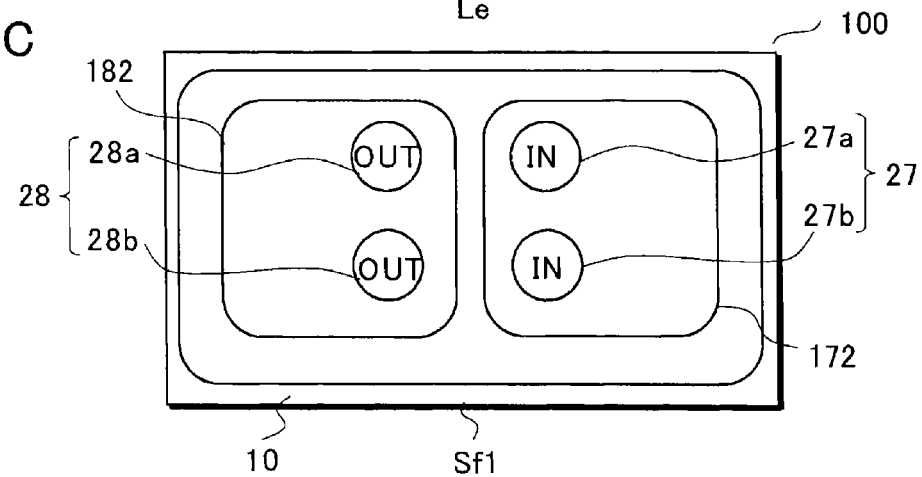

Below, description will be given of the multilayer electrode structure with reference to FIGS. 5A to 5C. FIGS. 5A to 5C are plan views showing one example of the multilayer electrode structure, and specifically showing that each electrode of the element region 20 has a two-layer electrode structure. FIG. 5A shows electrodes in a first layer. FIG. 5B shows the electrodes in the first layer and electrodes in a second layer. FIG. 5C shows the second layer and bump electrodes. Note that, the semiconductor substrate 10 is the same as that of FIG. 1A and FIG. 1B, and partitioned into a first region r1 and a second region r2. The first region r1 is provided with the element region 20. The second region r2 is provided with the unillustrated conductive path. Additionally, a gate pad electrode and the gate bump electrode are omitted in the drawings, but are disposed in desired positions (for example, positions along the short side Se).

As shown in FIG. 5A, in the electrode structure for the first layer, first contact holes CH1' and a second contact hole CH2 are provided to an insulating film (unillustrated), which covers the substrate 10. A first source electrode 171 for the first layer is disposed on the first contact holes CH1', and a first drain electrode 181 for the first layer is disposed on the second contact hole CH2.

As shown in FIG. 5B, the electrode structures in the first and second layers are arranged so that the electrodes in one layer cross those in the other layer. Specifically, an insulating film (unillustrated) is further disposed on the first source electrode 171 and the first drain electrode 181, and openings are made in desired positions of the insulating film to form through holes TH. One of the through holes TH is formed in the insulating film by the side of the first source electrode 171, and the other hole TH is formed in the insulating film by the side of the first drain electrode 181. A second source electrode 172 and a second drain electrode 182 in the second layer are arranged so as to cross the first source electrode 171 and the first drain electrode 181, respectively.

Furthermore, as shown in FIG. 5C, source bump electrodes 27a and 27b are provided on the second source electrode 172. Drain bump electrodes 28a and 28b are provided on the second drain electrode 182.

In this case, the resistance of a wire is somewhat increased by arranging the wiring around within the structure. Nevertheless, as in the case shown in FIG. 1A and FIG. 1B, the layouts of the first region r1 (element region 20) and the second region r2 is designed so that the second current path CP2 can be formed along the short side Se of the semiconductor substrate 10 (see FIG. 5A). Thus, the resistance Rb of the substrate 10 in the horizontal direction is reduced, resulting in significantly contributing to the reduction in the resistance of the device.

Figure 6:
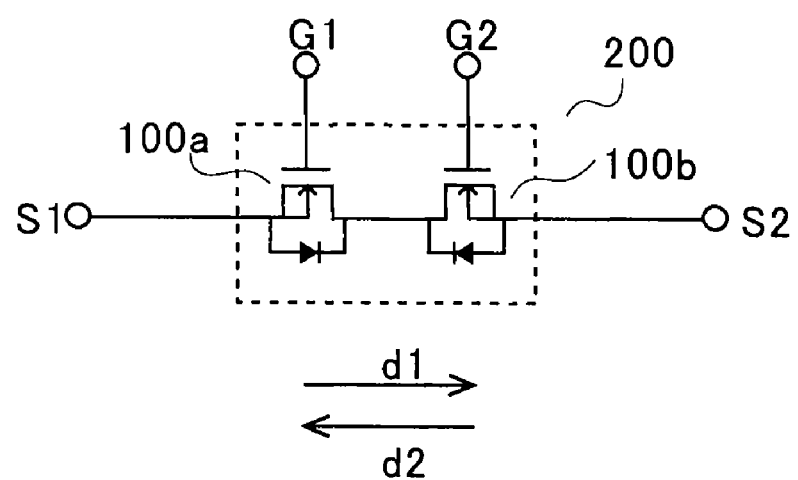
FIG. 6 is a circuit diagram for describing a semiconductor device according to a second embodiment of the present invention.
Figure 7A:
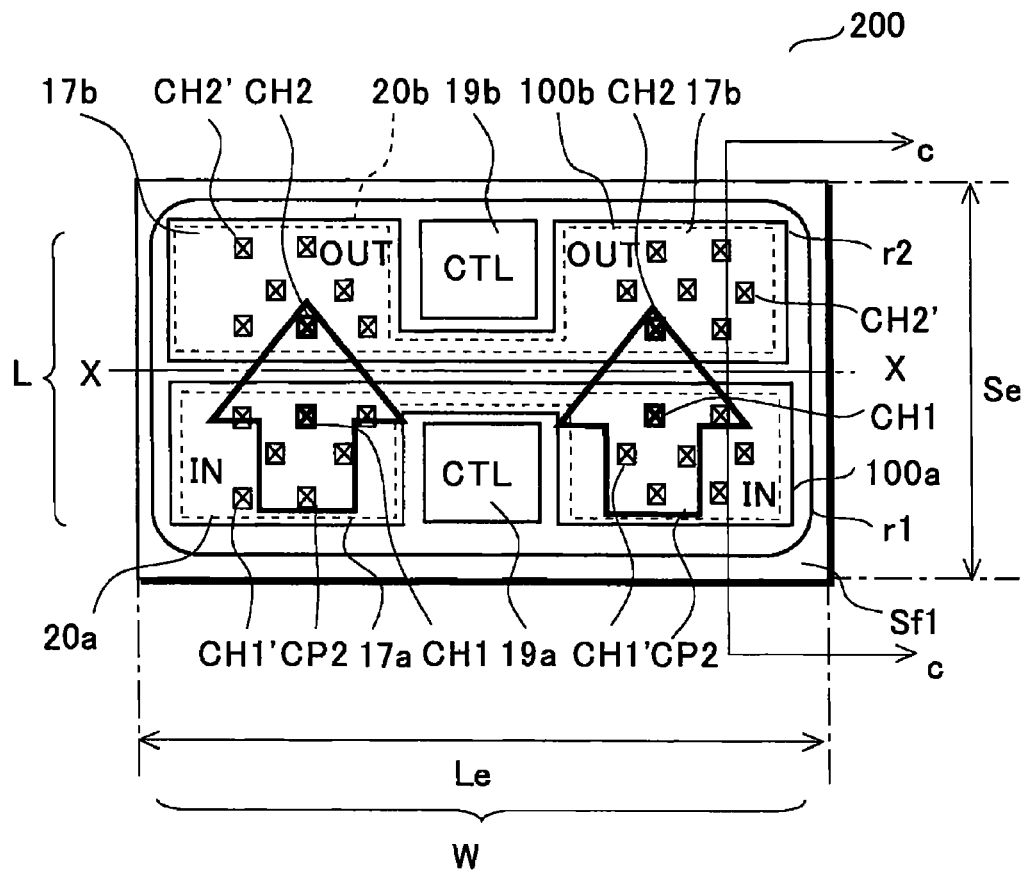
FIG. 7A is a plan view.
Figure 7B:
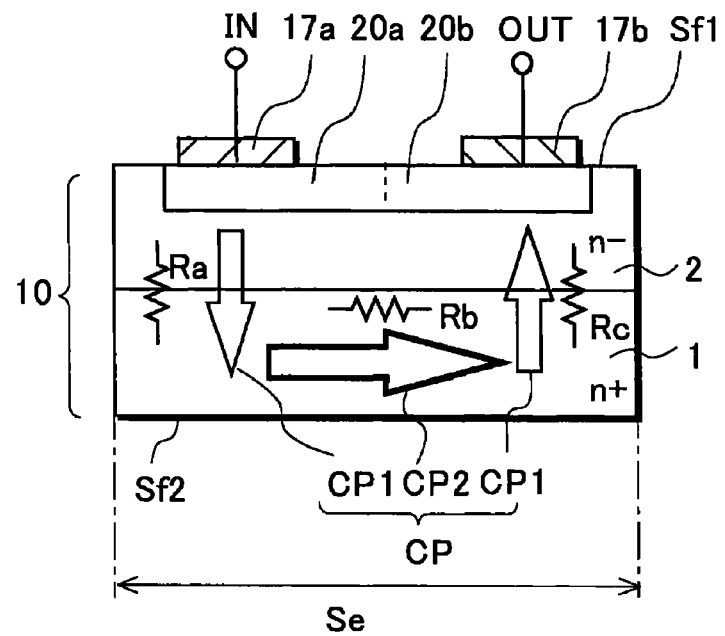
FIG. 7B is a side view, for describing the semiconductor device according to the second embodiment of the present invention.
Figure 8:
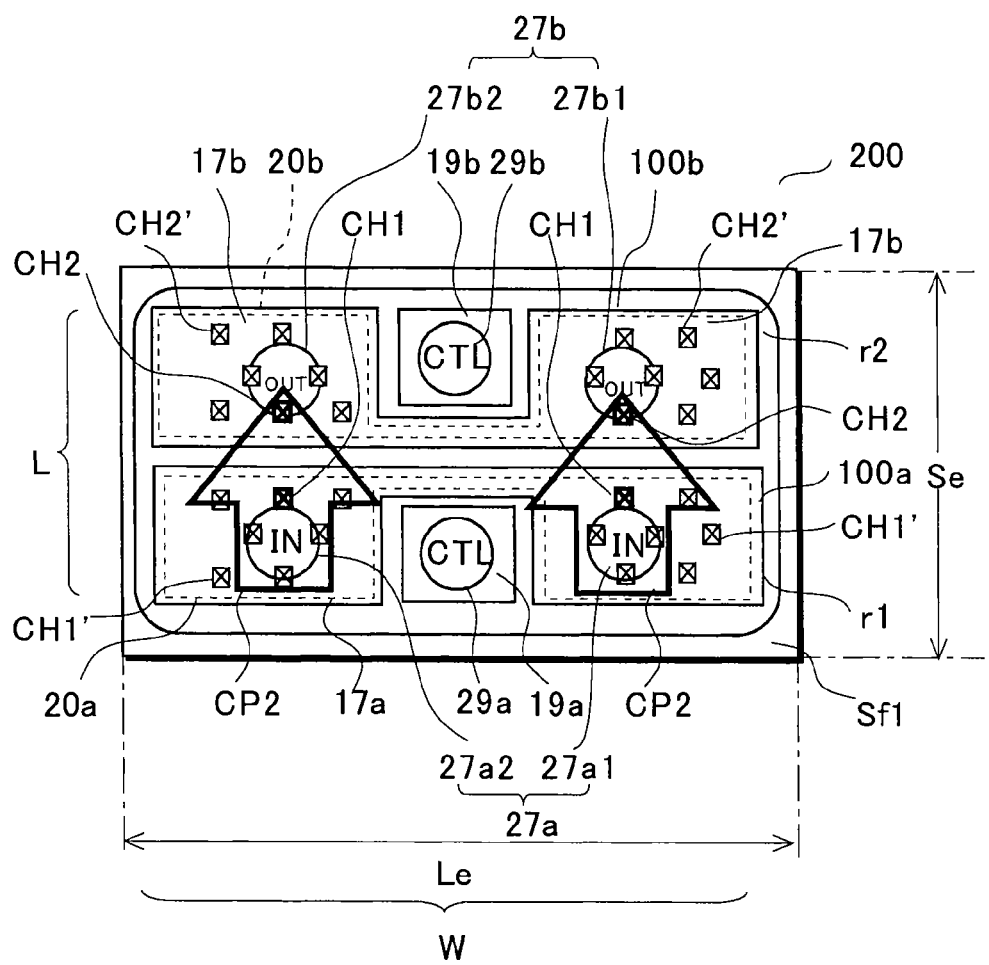
FIG. 8 is a plan view for describing the semiconductor device according to the second embodiment of the present invention.
Figure 9:
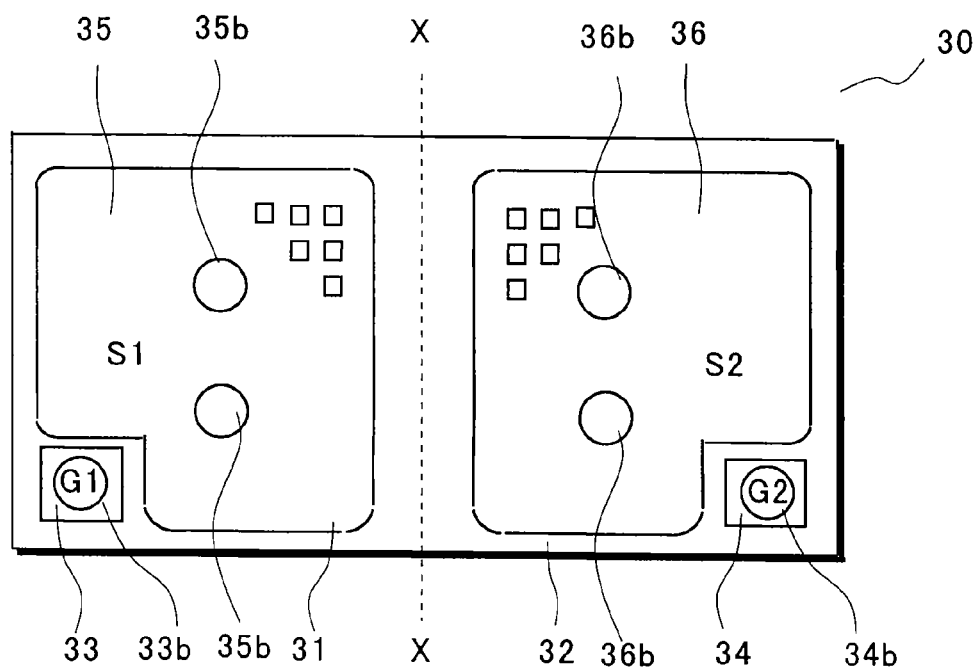
FIG. 9 is a plan view for describing a first conventional semiconductor device.
Figure 10:
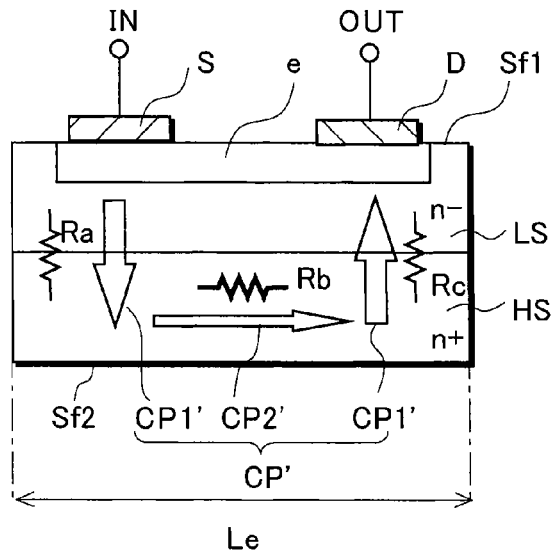
FIG. 10 is a side view for describing a second conventional semiconductor device.

Next, description will be give of a second embodiment of the present invention with reference to FIG. 6 to FIG. 8. Note that, the same constituents as those in the first embodiment will be denoted by the same reference numerals and symbols, and the overlapped description will be omitted.

As for an element region 20 provided to a semiconductor substrate (semiconductor chip) 10, the number thereof may be plural as long as the element regions are discrete (single-function) semiconductors. In the second embodiment, description will be given, as an example, in a case where two element regions 20a and 20b of a first MOSFET 100a and a second MOSFET 100b, respectively, are integrated into the single semiconductor substrate (semiconductor chip) 10 while sharing a drain.

There is a semiconductor device (MOSFET) used for switching which is known to switch not only between ON and OFF but also the direction of a current path (direction in which current flows) as in a case of the MOSFET employed in a protection circuit for a secondary battery (LIB: Lithium Ion Battery), for example.

FIG. 6 is a circuit diagram showing an example where a semiconductor device (switching element) capable of switching current paths in both directions is constituted of a MOSFET.

In a switching element 200, the first MOSFET 100a and the second MOSFET 100b each constituted of a large number of MOS transistor cells are connected to each other in serial while sharing a drain D of the MOSFETs. A gate signal is applied to gate terminals G1 and G2 to control both MOSFETs, and the current paths are switched in response to the potential difference between a first source terminal S1 and a second source terminal S2.

Each of the first MOSFET 100a and the second MOSFET 100b includes a parasitic diode. For example, the first MOSFET 100a is turned off, and the second MOSFET 100b is turned on by a control signal. When the potential of the first source terminal S1 is made higher than that of the second source terminal S2, a current path in a d1 direction is formed by the parasitic diode of the first MOSFET 100a and the second MOSFET 100b.

Meanwhile, the first MOSFET 100a is turned on, and the second MOSFET 100b is turned off by a control signal. When the potential of the first source terminal S1 is made lower than that of the second source terminal S2, a current path in a d2 direction is formed by the first MOSFET 100a and the parasitic diode of the second MOSFET 100b.

Furthermore, when both the gate terminals G1 and G2 are made to be turned on, a current path is formed without using the parasitic diodes.

FIG. 7A and FIG. 7B show an example of the above-mentioned switching element 200. FIG. 7A is a plan view showing the electrodes respectively connected to input, output and control terminals of the switching element 200. FIG. 7B is a schematic cross-sectional view taken along the line c-c in FIG. 7A.

As shown in FIG. 7A, the first element region 20a and the second element region 20b identical to each other are provided to the semiconductor substrate (chip) 10 in an approximately rectangular shape having a long side Le and a short side Se. The first element region 20a is for the first MOSFET 100a, and the second element region 20b is for the second MOSFET 100b.

For example, the element region 20a and the element region 20b respectively of the first MOSFET 100a and the second MOSFET 100b are arranged in line symmetry about the center line X-X extending in a direction along the long side Le of the semiconductor substrate 10. Additionally, a first source electrode 17a and a first gate pad electrode 19a are provided to the first element region 20a side. A second source electrode 17b and a second gate pad electrode 19b are provided to the second element region 20b side.

A source region (unillustrated) of the first MOSFET 100a is connected to the first source electrode 17a, which covers the first element region 20a. A gate electrode (unillustrated) of the first MOSFET 100a is extended to the periphery of the semiconductor substrate 10, and is connected to the first gate pad electrode 19a. The second MOSFET 100b has the same configuration.

As shown in FIG. 7B, the first MOSFET 100a and the second MOSFET 100b are provided to the same semiconductor substrate 10 having a first main surface Sf1 and a second main surface Sf2. Specifically, the first MOSFET 100a is provided to the first element region 20a of the semiconductor substrate 10, and the second MOSFET 100b is provided to the second element region 20b. Hence, the first MOSFET 100a and the second MOSFET 100b share the drain region.

The MOS transistor constituting each element region 20a and 20b is the same as that of the first embodiment, and thus the description thereof will be omitted. In the second embodiment, however, a drain terminal is not exposed to the outside, and a drain electrode is not provided.

In other words, only the first source electrode 17a, the first gate pad electrode 19a, the second source electrode 17b and the second gate pad electrode 19b are provided on the first main surface Sf1. The specific structure of these electrode portions is the same as that in the first embodiment. Moreover, the configurations of the first MOSFET 100a and the second MOSFET 100b are the same.

As described above, in the second embodiment, both the first source electrode 17a and the second source electrode 17b are provided on the first main surface Sf1 of the semiconductor substrate 10, and serve as a first electrode and a second electrode respectively connected to the input and output terminals. Then, a current path is formed between the electrodes.

Specifically, a control signal is applied to the first gate pad electrode 19a and the second gate pad electrode 19b. By this control signal, for example, the first MOSFET 100a is turned off, and the second MOSFET 100b is tuned on. At this time, when the potential of the first source electrode 17a is made higher than that of the second source electrode 17b, the current path is formed in the d1 direction in FIG. 6. On the other hand, in a case where the first MOSFET 100a is turned on, and the second MOSFET 100b is tuned off by a control signal, the potential of the first source electrode 17a is made lower than that of the second source electrode 17b, and thereby the current path is formed in the d2 direction opposite to the d1 direction. In addition, in a case where both the first MOSFET 100a and the second MOSFET 100b are turned on, the current path in the d1 or d2 direction is formed without using the parasitic diodes, but in response to the potential difference between the first source electrode 17a and the second source electrode 17b.

In other words, in the second embodiment, the current path is formed from the first source electrode 17a of the first MOSFET 100a to the second source electrode 17b of the second MOSFET 100b (or in the opposite direction) through the semiconductor substrate 10.

At this time, the layout for the element regions 20a, 20b and the like of the semiconductor substrate 10 is designed so that the main direction of second current paths CP2 can be formed along the short side Se of the semiconductor substrate (chip) 10.

The description will be given with the simplest example as follows. The semiconductor substrate 10 is partitioned into a first region r1 and a second region r2 by the center line X-X extending along the long side Le for convenience of the description. In the first region r1, the first element region 20a and the first source electrode 17a are provided in the input side of the second current path CP2. In the second region r2, the second element region 20b and the second source electrode 17b are provided in the output side of the second current path CP2. When the first region r1 (first element region 20a) and the second region r2 (second element region 20b) are arranged so as to be aligned along the short side Se of the semiconductor substrate 10, the second current path CP2 is formed in a direction along the short side Se of the semiconductor substrate 10. Thereby, a resistance Rb of the second current path CP2 in the horizontal direction is greatly reduced.

FIG. 8 shows a case in which bump electrodes are disposed on the semiconductor device in FIG. 7A and FIG. 7B as shown by circles.

First source bump electrodes 27a (27a1 and 27a2) are formed on, and connected to the first source electrodes 17a, respectively. Second source bump electrodes 27b (27b1 and 27b2) are formed on, and connected to, the second source electrodes 17b, respectively. Similarly, a first gate bump electrode 29a and a second gate bump electrode 29b are formed on the first gate pad electrode 19a and the second gate pad electrode 19b, respectively.

Moreover, included are first contact holes CH1', which connect the first source electrode 17a to the first element region 20a, and second contact potions CH2', which connect the second source electrode 17b to the second element region 20b. In this embodiment, among the first contact holes CH1' and the second contact holes CH2', a set of a first contact hole CH1 and a second contact hole CH2 which are positioned closest to each other is aligned along the short side Se so as to be parallel to the short side Se.

Here, the example in which the two source bump electrodes 27a and the two source bump electrodes 27b are provided is shown, but the number of each bump electrode 27a, 27b, 29a and 29b is not limited to the one illustrated.

However, when the bump electrodes are provided as described above, a first bump electrode (first source bump electrode 27a1) and a second bump electrode (second source bump electrode 27b1) which are positioned closest to each other among the bump electrodes respectively connected to input and output terminals are disposed along to the short side Se so as to be parallel to the short side Se.

As a result, the second current path CP2 formed along the short side Se is connected to external terminals (the input terminal and the output terminal) without being arranged around in the horizontal direction on the first main surface Sf1. Accordingly, the resistance of each electrode in the horizontal direction is also reduced as much as possible, resulting in significantly contributing to the reduction in the resistance of the device.

Hereinabove, the description has been given of the n channel MOSFET as an example of this embodiment. However, the present invention is not limited to this.

The present invention can be implemented to a p channel MOSFET, which has the opposite conductive type as above. Moreover, the present invention is not limited to these, and can be implemented to a bipolar transistor or a diode as above, and the same effect is obtainable.

For example, a case of employing a bipolar transistor is as in the following description. An element region is provided with a base region of one conductivity type in a semiconductor substrate of an opposite conductivity type serving as a collector region, and an emitter region of the opposite conductivity type is provided to the surface of the base region. This element region 20 is provided to a first region r1 as shown in FIG. 1A and FIG. 1B. A conductive path 22 connected to the collector region is provided to a second region r2. Moreover, an emitter electrode connected to the emitter region and collector electrodes connected to the collector region are provided in the patterns of the source electrode 17 and the drain electrodes 18, respectively, as shown in FIG. 1A and FIG. 1B. In this case, a base electrode connected to the base region is provided in the pattern of the gate pad electrode 19 in FIG. 1A. When bump electrodes are provided, the bump electrodes are provided as shown in FIG. 2. Specifically, emitter bump electrodes, collector bump electrodes and a base bump electrode are provided in the positions of the source bump electrodes 27, the drain bump electrodes 28 and the gate bump electrode 29, respectively.

Thus, a second current path CP2 is formed in a direction along a short side Se of a substrate 10 as shown in FIG. 1A and FIG. 1B.

Moreover, a case of employing a diode is as in the following description. An element region 20 is provided with an impurity region of one conductivity type, which is connected to an anode electrode in a semiconductor substrate of an opposite conductivity type, which is connected to cathode electrodes. The element region 20 is provided to a first region r1 as shown in FIG. 1A. A conductive path 22 connected to the semiconductor substrate of the opposite conductivity type is provided to a second region r2. The anode electrode and the cathode electrodes are provided in the patterns of the source electrode 17 and the drain electrodes 18, respectively, as shown in FIG. 1A and FIG. 1B. When bump electrodes are provided, the bump electrodes are provided as shown in FIG. 2. Specifically, anode bump electrodes and cathode bump electrodes are provided in the positions of the source bump electrodes 27 and the drain bump electrodes 28, respectively.

Thus, a second current path CP2 is formed in a direction along a short side Se of a substrate 10 as shown in FIG. 1A and FIG. 1B.

According to the present invention, firstly, a resistance of a substrate in a horizontal direction can be reduced. This can be achieved because, in a semiconductor device provided with electrodes connected to input and output terminals on a first main surface of the rectangular-shaped chip, an element region is arranged so that the current path in a horizontal direction of a substrate can be formed along a direction of a short side of the chip.

Secondly, since first bump electrodes connected to input terminals and second bump electrodes connected to output terminals are provided, and the first and second bump electrodes which are positioned closest to each other among the first and second bump electrodes are arranged so that the straight line between the first and second bump electrodes can be parallel to the short side of the chip, each resistance between the electrodes provided on the first main surface can be reduced accordingly.

Thirdly, the present invention can significantly contribute to the reduction in the resistance in a semiconductor device, the resistance of which largely depends on the shape of a current path in a horizontal direction of a substrate. The reduction is significant especially in the case of a bare chip which is mounted by a flip chip mounting, and which achieves lower cost by omitting a metal layer to be formed on a second main surface.

What is claimed is:
1. A semiconductor device comprising:
a rectangular semiconductor substrate;
a discrete semiconductor element disposed on a first portion of a first primary plane of the rectangular semiconductor substrate;
a first electrode disposed on the first portion of the first primary plane; and
a second electrode disposed on a second portion of the first primary plane, wherein the device is configured to form a current path comprising a first path from the first electrode to a first part of the substrate below the first electrode, a second path from the first part to a second part of the substrate below the second electrode, and a third path from the second part of the substrate to the second electrode, and the second path is parallel to a short side of the rectangular semiconductor substrate.

2. The semiconductor device of claim 1, further comprising a first contact hole connecting the first electrode and the first portion of the first primary plane and a second contact hole connecting the second electrode and the second portion of the first primary plane, wherein the first contact hole and the second contact hole are disposed parallel to the short side.

3. The semiconductor device of claim 1, further comprising a first bump electrode disposed on the first electrode and a second bump electrode disposed on the second electrode.

4. The semiconductor device of claim 3, wherein the first and second bump electrodes are disposed parallel to the short side.

5. The semiconductor device of claim 1, further comprising a circuit board on which the rectangular semiconductor substrate is mounted d by a flip chip mounting.

6. A semiconductor device comprising:
a rectangular semiconductor substrate comprising two long sides and two short sides;
an elongated input electrode disposed on a first surface of the substrate along one of the long sides of the substrate so that a direction of the elongation of the input electrode is parallel to the long sides; and
an output electrode disposed on the first surface of the substrate between the elongated input electrode and another of the long sides of the substrate,
wherein the rectangular semiconductor substrate comprises a high impurity substrate and a low impurity layer formed on the high impurity substrate,
the input electrode and the output electrode are electrically connected through the high impurity substrate,
a length of the output electrode in the direction of the elongation of the input electrode is smaller than a length of the input electrode in the direction of the elongation of the input electrode.

7. The semiconductor device of claim 1, wherein no discrete semiconductor element is disposed on the second portion of the first primary plane.

8. The semiconductor device of claim 1, wherein the second electrode is smaller than the first electrode.

9. The semiconductor device of claim 6, wherein the length of the output electrode in the direction of the elongation of the input electrode is smaller than half of the length of the input electrode in the direction of the elongation of the input electrode.

* * * * *